United States Patent
Chang et al.

(10) Patent No.: US 8,274,149 B2
(45) Date of Patent: Sep. 25, 2012

(54) SEMICONDUCTOR DEVICE PACKAGE HAVING A BUFFER STRUCTURE AND METHOD OF FABRICATING THE SAME

(75) Inventors: Hsiao-Chuan Chang, Kaohsiung (TW);
Tsung-Yueh Tsai, Kaohsiung (TW);
Yi-Shao Lai, Yonghe (TW);
Ming-Hsiang Cheng, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 45 days.

(21) Appl. No.: 12/749,191

(22) Filed: Mar. 29, 2010

(65) Prior Publication Data
US 2011/0233764 A1 Sep. 29, 2011

(51) Int. Cl.
*H01L 23/488* (2006.01)
*H01L 21/60* (2006.01)

(52) U.S. Cl. ......... 257/737; 257/E23.023; 257/E21.509; 257/734; 257/738; 257/668; 257/773; 257/774; 257/685; 257/686; 257/777; 257/723; 257/724; 257/728

(58) Field of Classification Search .................. 257/737, 257/734, 738, 668, E21.509, E23.023, 773, 257/774, 685, 686, 777, 723, 724, 728
See application file for complete search history.

(56) References Cited

U.S. PATENT DOCUMENTS

| | | | | |
|---|---|---|---|---|
| 6,731,015 | B2 * | 5/2004 | Wu et al. | 257/796 |
| 6,867,486 | B2 * | 3/2005 | Hong | 257/686 |
| 2007/0158826 | A1 * | 7/2007 | Sakakibara et al. | 257/723 |
| 2008/0157316 | A1 | 7/2008 | Yang | |
| 2008/0197474 | A1 * | 8/2008 | Yang et al. | 257/690 |
| 2008/0224306 | A1 * | 9/2008 | Yang | 257/725 |
| 2008/0274593 | A1 * | 11/2008 | Yang et al. | 438/113 |
| 2009/0145649 | A1 * | 6/2009 | Horiuchi et al. | 174/260 |

FOREIGN PATENT DOCUMENTS
CN  101232008  7/2008
* cited by examiner

*Primary Examiner* — A O Williams
(74) *Attorney, Agent, or Firm* — Muncy, Geissler, Olds & Lowe, PLLC

(57) ABSTRACT

A semiconductor device package and a method of fabricating the same are disclosed. The semiconductor device package includes a substrate, a buffer structure, two active chips and a bridge chip. The substrate has a cavity, a first surface and a second surface opposite to the first surface. The cavity is extended from the first surface toward the second surface, and the buffer structure is disposed in the cavity. The active chips are disposed on and electrically connected to the first surface and around the cavity. The active chips both have a first active surface. The bridge chip is disposed in the cavity and above the buffer structure. The bridge chip has a second active surface, the second active surface faces the first active surfaces and is partially overlapped with the first active surfaces, the bridge chip is used for providing a proximity communication between the active chips.

14 Claims, 4 Drawing Sheets

SEMICONDUCTOR DEVICE PACKAGE HAVING A BUFFER STRUCTURE AND METHOD OF FABRICATING THE SAME

BACKGROUND OF THE INVENTION

1. Field of the Invention

The invention relates in general to a device package, and more particularly to a semiconductor device package.

2. Description of the Related Art

Nowadays, the semiconductor technology has been applied to uncountable products including memory cards, computers, mobile phones, monitors, etc. The semiconductor manufacturing process requires accuracy because of the miniature size and delicate structure of the semiconductor components, thus each step during the process is strictly monitored and controlled in case of mistakes happening. However, even so the yield and quality of semiconductor-related products remain limited, and the requirement for the functionality of the products is getting higher among the consumers.

On the manufacturing process, a semiconductor device package is easily damaged due to cracks in the chips of the package when the chips are subjected to stress. The flaws of chips are mostly caused by the process gadgets or because of the fragile feature of the chip structure. It is therefore necessary for all the manufacturers to seek for a solution to the above mentioned problems of the conventional operation.

SUMMARY OF THE INVENTION

It is therefore an object of the invention to provide a semiconductor device package and a method of fabricating the same. The semiconductor device package has a buffer structure for controlling the gap between the chip and the substrate and absorbing the impact to the chip, which avoids damages to the chip and thus improves the yield and quality of the relative products.

The invention achieves the above-identified object by providing a semiconductor device package including a substrate, a buffer structure, two active chips and a bridge chip. The substrate has a cavity, a first surface and a second surface opposite to the first surface. The cavity is extended from the first surface toward the second surface, and the buffer structure is disposed in the cavity. The active chips are mechanically disposed on and electrically connected to the first surface and around the cavity, wherein the active chips both have a first active surface. The bridge chip is disposed in the cavity and above the buffer structure, wherein the bridge chip has a second active surface, the second active surface faces the first active surfaces and is partially overlapped with the first active surfaces, the bridge chip is used for providing a proximity communication between the active chips.

The invention achieves the above-identified object by providing a semiconductor device package including a substrate, a buffer structure, two pillar sets, two active chips and a bridge chip. The substrate has a first surface and a second surface opposite to the first surface. The buffer structure is disposed on the first surface. The pillar sets are disposed on two sides of the buffer structure respectively, and each of the pillar sets has a plurality of pillars. The active chips are mechanically disposed on the pillar sets and electrically connected to the first surface, wherein the active chips both have a first active surface. The bridge chip is disposed on the buffer structure and below the active chips, wherein the bridge chip has a second active surface, the second active surface faces the first active surfaces and is partially overlapped with the first active surfaces, the bridge chip is used for providing a proximity communication between the two active chips.

The invention achieves the above-identified object by providing a method of fabricating a semiconductor device package, the method includes the steps of providing a chip subassembly comprising two active chips and a bridge chip, wherein the bridge chip has an active surface facing and being partially overlapped with the active surfaces of the two active chips, respectively, thereby providing a proximity communication between the two active chips; forming a vesicant material on a substrate or on the backside surface of the bridge chip; mechanically and electrically connecting the active chips to the substrate such that the vesicant material is disposed between the substrate and the backside surface of the bridge chip; and, expanding the vesicant material by heating the substrate to form a buffer structure filling a gap between the substrate and the bridge chip.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1:
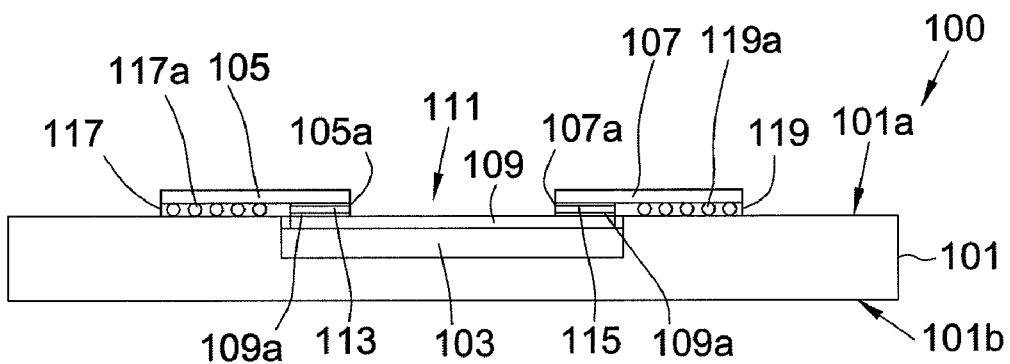
FIG. 1 shows a semiconductor device package according to a preferred embodiment of the invention.

FIG. 1 shows a semiconductor device package according to a preferred embodiment of the invention. The semiconductor device package 100 includes a substrate 101, a buffer structure 103, two active chips 105, 107 and a bridge chip 109. The substrate 101 has a cavity 111, a first surface 101a and a second surface 101b opposite to the first surface 101a. The cavity 111 is extended from the first surface 101a toward the second surface 101b, and the buffer structure 103 is disposed in the cavity 111. The active chips 105 and 107 are mechanically and electrically connected to the first surface 101a and around the cavity 111. The active chips 105 and 107 both have an active surface. The bridge chip 109 is disposed in the cavity 111 and above the buffer structure 103. The bridge chip 109 has an active surface that faces the active surfaces of the active chips 105 and 107 and is partially overlapped with the active surfaces of the active chips 105 and 107. Therefore, the bridge chip 109 can be used for providing a proximity communication between the active chips 105 and 107.

The buffer structure 103 includes a vesicant material, which is preferably a thermosetting material. For example, the vesicant material is a heat release tape. In particular, the heat release tape is REVALPHA #3195MS heat release tape, which decreases its bond strength at a temperature of from about 90° C. to about 150° C. and which is available from Nitto Denko of Osaka, Japan. The buffer structure 103 can help to control the gap between the active chips 105 and 107 and the bridge chip 109, and prevents the bridge chip 109 from direct contacting the substrate 101 on the manufacturing process as well as provides support to the bridge chip 109.

As shown in FIG. 1, the semiconductor device package 100 further includes two adhesion layers 113 and 115. The adhesion layer 113 is disposed between the active chip 105 and the bridge chip 109, and the adhesion layer 115 is disposed between the active chip 107 and the bridge chip 109. The adhesion layers 113 and 115 are used for combining the active chips 105, 107 and the bridge chip 109. The adhesion layers 113 and 115 may be formed of underfill material. In one embodiment, the adhesion layers 113 and 115 may comprise spacer balls thereby helping to control the gap between the active chips and the bridge chip. Take transmission by capacitive coupling for example. The active surfaces of the active chips 105 and 107 both have a plurality of signal pads, i.e. signal pads 105a and 107a, at least partially and respectively aligned with a plurality of signal pads 109a disposed on the active surface of the bridge chip 109, such that there is capacitance effect generated between a pair of the signal pads of the active chips 105 and 107 and the bridge chip 109 because the signal pads of the active chips 105 and 107 are capacitively or inductively coupled to the signal pads of the bridge chip 109, which provides the signal communication between the active chips 105, 107 and the bridge chip 109. It is this capacitive coupling that provides signal paths between the active chip 105 and the bridge chip 109 and between the active chip 107 and the bridge chip 109. Changes in the electrical potential of the surface metal of a signal pad cause corresponding changes in the electrical potential of the metal comprising the corresponding signal pad. Suitable drivers of the transmitter circuit and sensing circuits of the receiver circuit in the respective chip make communication through this small capacitance possible.

As shown in FIG. 1, the active chips 105 and 107 are mechanically and electrically connected to contacts or pads (not shown) on the first surface 101a of the substrate 101 via solder bumps 117a and 119a, respectively. The gap between the chips and the substrate is sealed by an underfill 117 and 119 thereby strengthening and stabilizing the interconnection between the chips and the substrate and increasing the solder joint reliability between the chips and the substrate.

Alternatively, the active chips 105 and 107 may be mechanically and electrically connected to the first surface 101a via metal bumps preformed on the bonding pads of the chips and an anisotropic conductive adhesive film (ACF). One type of anisotropic adhesive suitable for forming the ACF is known as a "z-axis anisotropic adhesive". Z-axis anisotropic adhesives are filled with conductive particles to a low level such that the particles do not contact each other in the xy plane. Therefore, compression of the material in the z direction establishes an electrical path.

Figure 2:
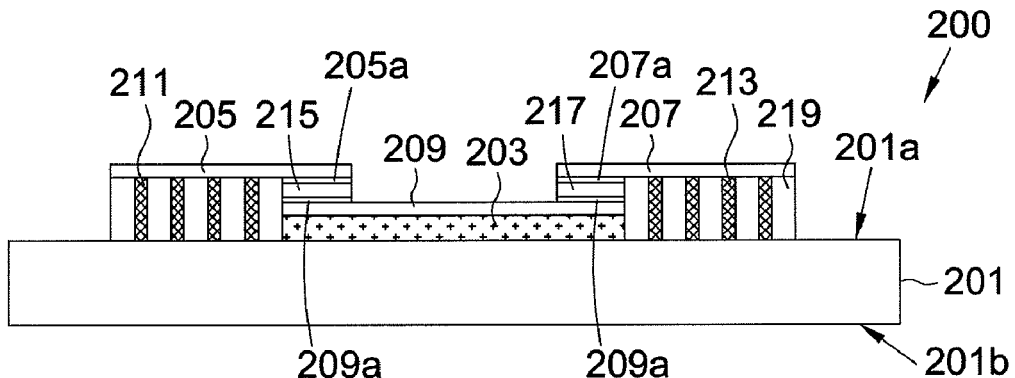
FIG. 2 shows a semiconductor device package according to another preferred embodiment of the invention.

FIG. 2 shows a semiconductor device package according to another preferred embodiment of the invention. The semiconductor device package 200 includes a substrate 201, a buffer structure 203, two active chips 205 and 207, a bridge chip 209 and two pillar sets 211 and 213. The substrate 201 has a first surface 201a and a second surface 201b opposite to the first surface 201a. The buffer structure 203 is disposed on the first surface 201a.

The pillar sets 211 and 213 are disposed on two sides of the buffer structure 203 respectively, and each of the pillar sets 211 and 213 has a plurality of pillars. The pillars of the pillar sets 211 and 213 can be conductive pillars made of metals such as Cu, Au, Ag, etc.

The active chips 205 and 207 are disposed on the pillar sets 211 and 213 and electrically connected to the first surface 201a by the pillar sets 211 and 213. The active chips 205 and 207 both have an active surface. The active chips 205 and 207 have a plurality of signal pads 205a and 207a, respectively. The bridge chip 209 is disposed on the buffer structure 203 and below the active chips 205 and 207, and has an active surface and a plurality of signal pads 209a. The active surface of the bridge chip 209 faces the active surfaces of the active chips 205 and 207 and the signal pads 205a and 207a are aligned with the signal pads 209a on the active surface of the bridge chip 209, such that the bridge chip 209 can be used for providing a proximity communication between the active chips 205 and 207.

As shown in FIG. 2, the semiconductor device package 200 further includes two adhesion layers 215 and 217. The adhesion layer 215 is disposed between the active chip 205 and the bridge chip 209 for combining the active chip 205 with the bridge chip 209. The adhesion layer 217 is disposed between the active chip 207 and the bridge chip 209 for combining the active chip 207 with the bridge chip 209. The adhesion layers 215 and 217 may be formed of underfill material. In one embodiment, the adhesion layers 215 and 217 may comprise spacer balls thereby helping to control the gap between the active chips and the bridge chip.

The semiconductor device package 200 further includes an underfill 219. The underfill 219 is disposed between the pillar sets 211, 213 and the substrate 201, filling the space within the pillar sets 211 and 213. The underfill 219 is used for enhancing the attachment of the pillar sets 211 and 213 to the substrate 201 as well as protecting the pillars of the pillar sets 211 and 213.

Figure 3:
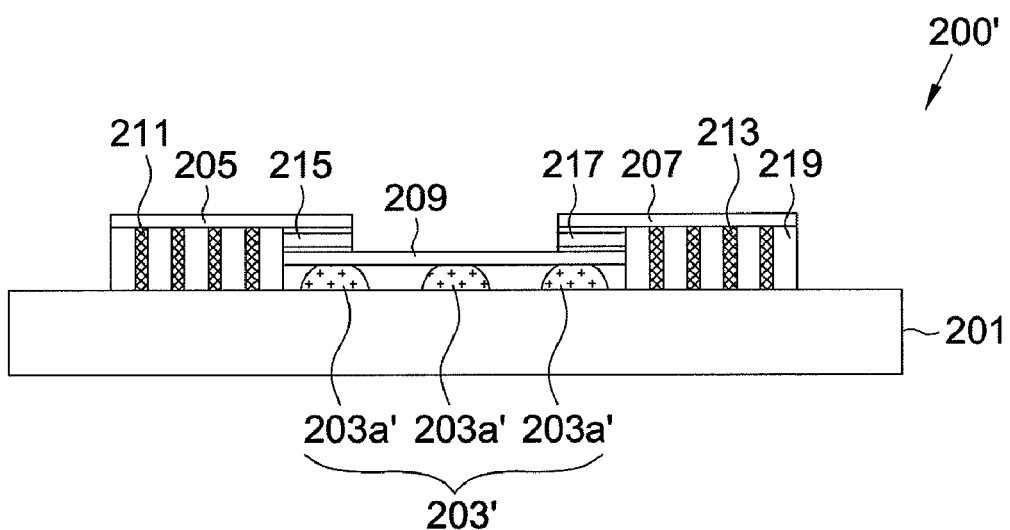
FIG. 3 shows a semiconductor device package according to yet another preferred embodiment of the invention.

The buffer structures disclosed above are layer structure however the invention is not limited thereto. FIG. 3 shows a semiconductor device package according to yet another preferred embodiment of the invention. The semiconductor device package 200' differs from the semiconductor device package 200 in the buffer structure, so the same elements are assigned with the same reference numbers and not explained again. The buffer structure 203' includes a plurality of buffer knobs 203a'. The bridge chip 209 is disposed on the buffer knobs 203a'.

Figure 4:
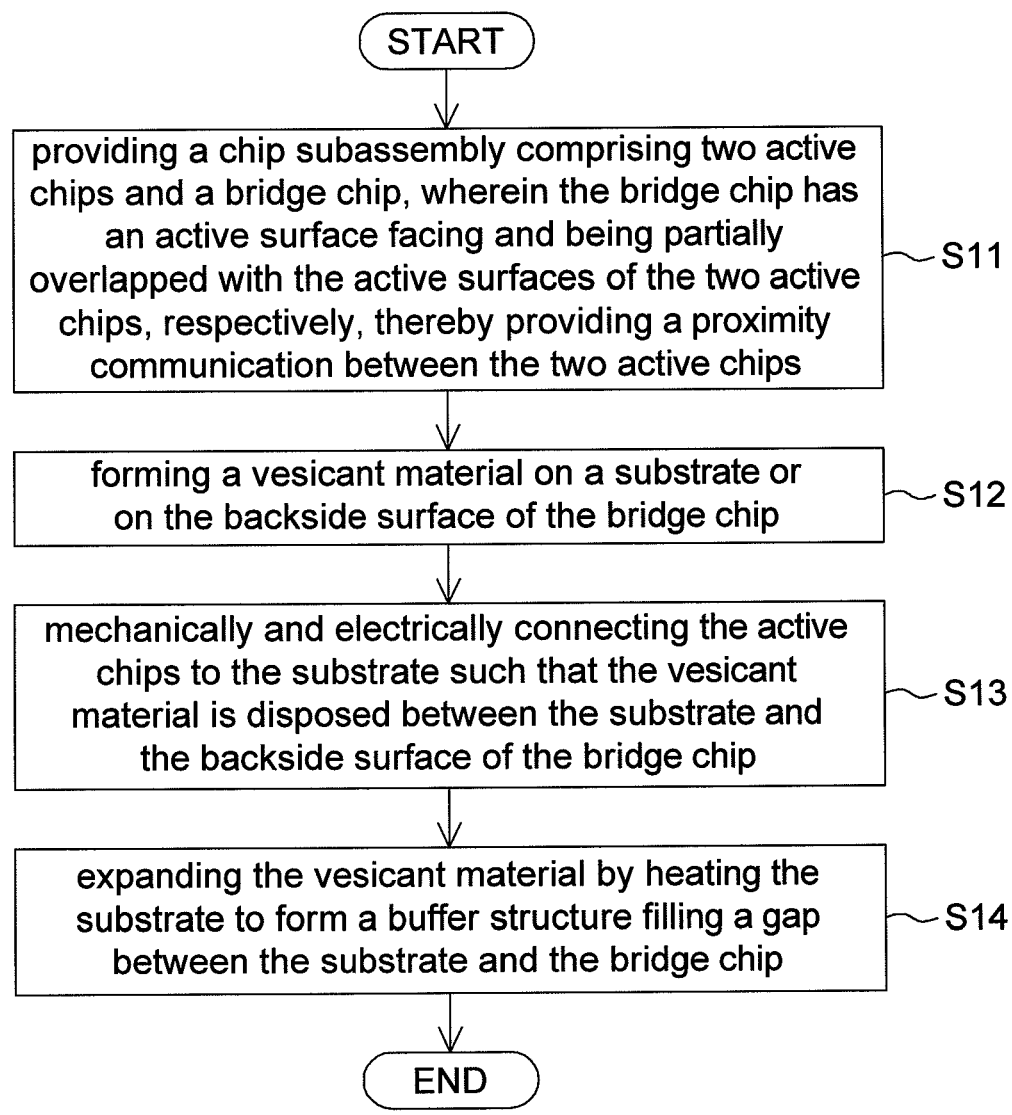
FIG. 4 shows a flowchart of a method of fabricating a semiconductor device package according to a preferred embodiment of the invention.
Figure 5A:
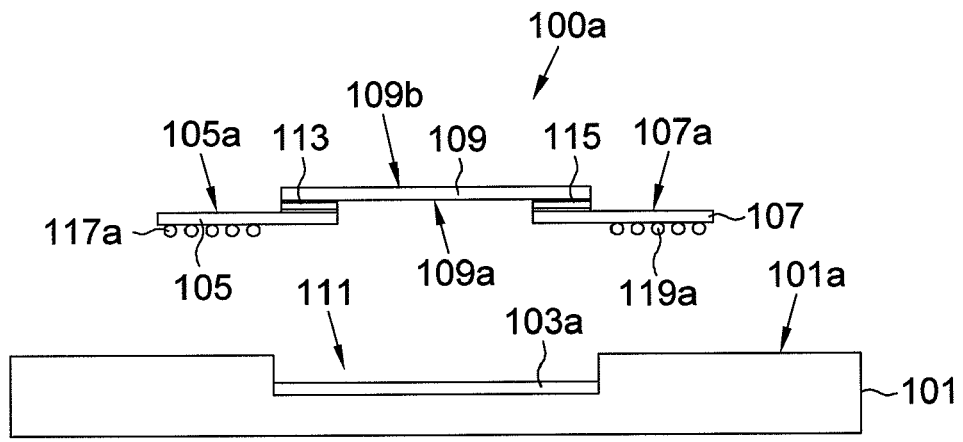
FIGS. 5A~5C show the steps of fabricating the semiconductor device package of FIG. 1.
Figure 5B:
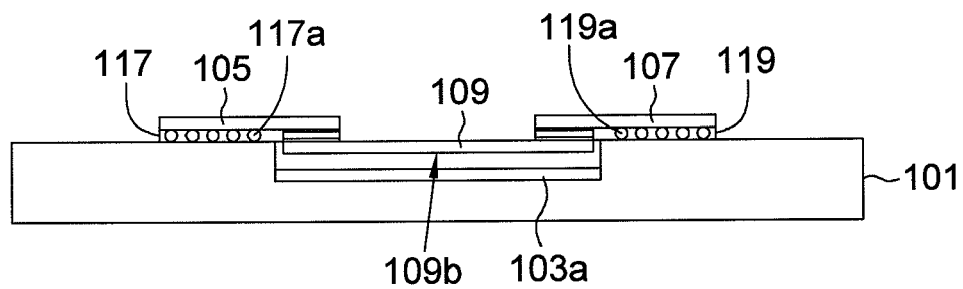
Figure 5C:
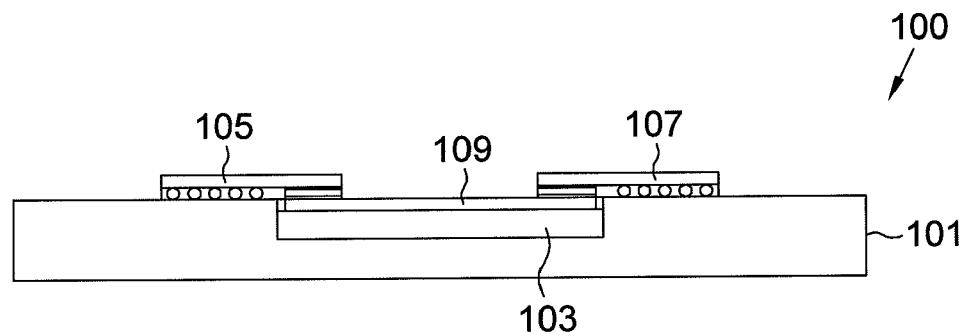

FIG. 4 shows a flowchart of a method of fabricating a semiconductor device package according to a preferred embodiment of the invention. The method includes steps S11 to S14, and is elaborated with the manufacture of the semiconductor device package 100 of FIG. 1. FIGS. 5A~5C show the steps of fabricating the semiconductor device package of FIG. 1.

At first, as shown in step S11 and FIG. 5A, a chip subassembly 100a comprising two active chips 105 and 107 and a bridge chip 109 is provided, wherein the bridge chip 109 has an active surface 109a facing and being partially overlapped with the active surfaces 105a and 107a of the two active chips 105 and 107, respectively, thereby providing a proximity communication between the two active chips 105 and 107. The active chips 105 and 107 are connected to the bridge chip 109 by the two adhesion layers 113 and 115.

Next, as shown in step S12 and FIG. 5A, a vesicant material 103a is formed on a substrate 101, or the vesicant material 103a is formed on the backside surface 109b of the bridge chip 109. The substrate 101 has a cavity 111 for receiving the bridge chip 109. Preferably, the vesicant material 103a is applied to the cavity 111 for easy positioning.

Then, as shown in step S13 and FIG. 5B, the active chips 105 and 107 are mechanically and electrically connected to the substrate 101 such that the vesicant material 103a is disposed between the substrate 101 and the backside surface 109b of the bridge chip 109. In the beginning of this step, the chip subassembly 100*a* (shown in FIG. 5A) is then turned upside down, and the bridge chip 109 is aligned with the cavity 111 before connecting the active chips 105 and 107 to the substrate 101. After the bridge chip 109 is located in the cavity 111, a reflow operation is conducted to melt the solder bumps 117*a* and 119*a* preformed on the active chips 105 and 107 to form a solder bond between the corresponding pads or contacts on the chips and the substrate, thereby mechanically and electrically attaching the active chips 105 and 107 to the substrate 101. And, the gap between the chips 105, 107 and the substrate 101 is sealed by underfill 117 and 119 thereby strengthening and stabilizing the interconnection between the chips and the substrate and increasing the solder joint reliability between the chips and the substrate.

After that, as shown in step S14, the vesicant material 103*a* is expanded by heating the substrate 101 to form a buffer structure 103 filling a gap between the substrate 101 and the bridge chip 109, as shown in FIG. 5C. Herein the fabrication of the semiconductor device package 100 is completed.

Figure 6A:
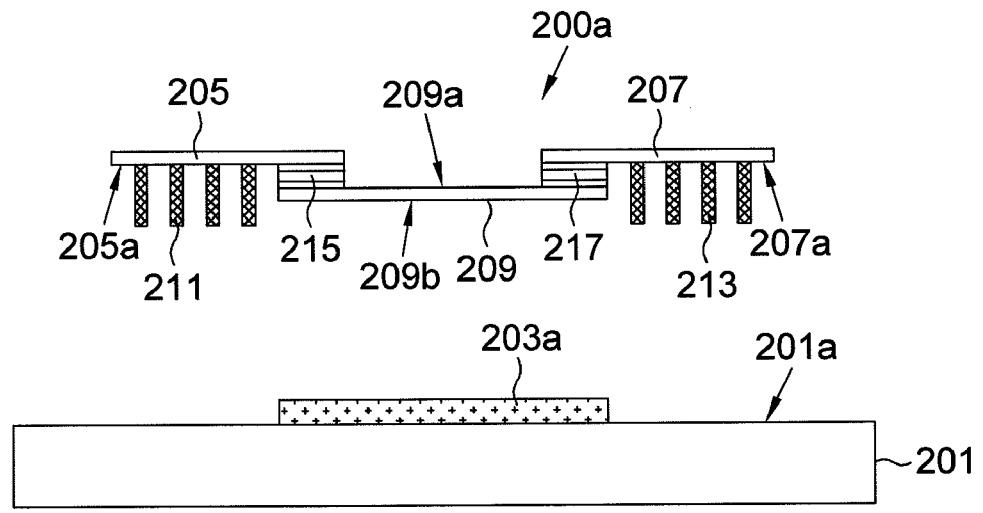
FIGS. 6A~6C show the steps of fabricating the semiconductor device package of FIG. 2.
Figure 6B:
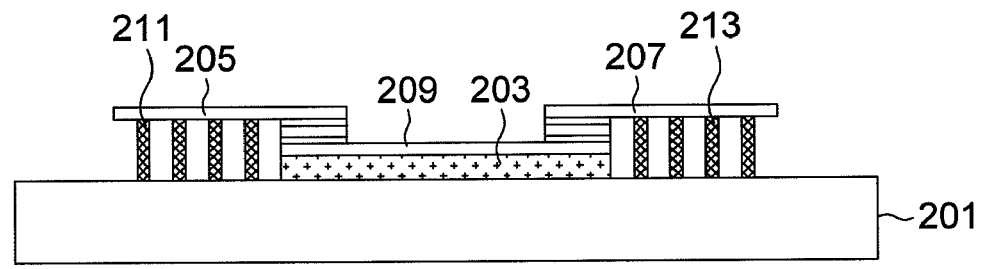
Figure 6C:
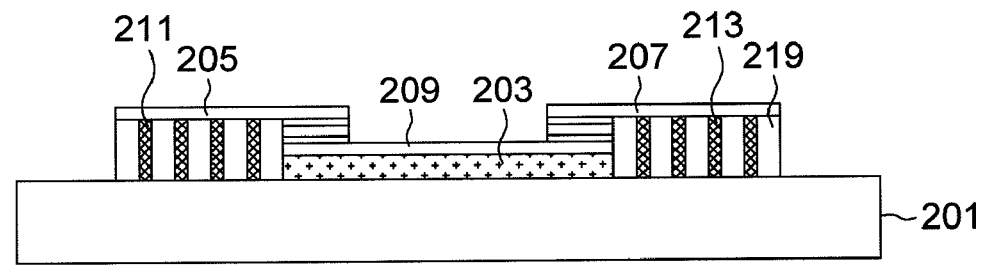

FIGS. 6A~6C show the steps of fabricating the semiconductor device package of FIG. 2. As shown in FIG. 6A, a chip subassembly 200*a* comprising two active chips 205 and 207 and a bridge chip 209 is provided, wherein the bridge chip 209 has an active surface 209*a* facing and being partially overlapped with the active surfaces 205*a* and 207*a* of the two active chips 205 and 207, respectively, thereby providing a proximity communication between the two active chips 205 and 207. The active chips 205 and 207 are connected to the bridge chip 209 by the two adhesion layers 215 and 217. The chip subassembly 200*a* further comprises two pillar sets 211 and 213, which are disposed on the active chips 205 and 207, respectively, and located on two sides of the bridge chip 209.

Next, a vesicant material 203*a* is formed on the first surface 201*a* of a substrate 201.

Then, the active chips 205 and 207 are mechanically and electrically connected to the substrate 201 such that the vesicant material 203*a* is disposed between the substrate 201 and the bridge chip 209, and the two pillar sets 211 and 213 are located on two sides of the vesicant material 203*a* and the bridge chip 209.

Next, the vesicant material 203*a* is expanded by heating the substrate 201 to form a buffer structure 203 filling a gap between the substrate 201 and the bridge chip 209, as shown in FIG. 6B.

Then, an underfill material is provided to fill the space within the pillar sets 211 and 219 so as to form an underfill 219, as shown in FIG. 6C, for enhancing the attachment of the pillar sets 211 and 213 to the substrate 201 and protecting the pillars of the pillar sets 211 and 213. Herein the fabrication of the semiconductor device package 200 is completed. The process for manufacturing the semiconductor device package 200' of FIG. 3 is similar to that of the semiconductor device package 200 and is not elaborated again.

The semiconductor device package and the method of fabricating the semiconductor device package according to the preferred embodiment of the invention are disclosed above. The semiconductor device package has a buffer structure filling the gap between the bridge chip and the substrate, so as to provide support to the bridge chip and avoid the bridge chip being in direct contact with the substrate, hence eliminating the possibility of applying force to the bridge chip which causes stress concern to the semiconductor device package. Moreover, the buffer structure can be formed as a layer or be consisted of a plurality of buffer knobs, which as well absorbs the mechanical impact to the bridge chip. Therefore, the quality and yield of the semiconductor device package are greatly improved.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor device package, comprising:
   a substrate having a cavity, a first surface and a second surface opposite to the first surface, wherein the cavity is extended from the first surface toward the second surface;
   a buffer structure disposed in the cavity, wherein the buffer structure comprises a vesicant material;
   two active chips mechanically disposed on and electrically connected to the first surface and around the cavity, wherein the active chips both have a first active surface; and
   a bridge chip disposed in the cavity and above the buffer structure, wherein the bridge chip has a second active surface, the second active surface faces the first active surfaces and is partially overlapped with the first active surfaces, the bridge chip is used for providing a proximity communication between the two active chips.

2. The semiconductor device package according to claim 1, wherein the vesicant material is a thermosetting material.

3. The semiconductor device package according to claim 1, wherein the buffer structure comprises a plurality of knobs.

4. The semiconductor device package according to claim 1, further comprising two adhesion layers disposed between the active chips and the bridge chip respectively.

5. The semiconductor device package according to claim 1, further comprising two adhesion layers disposed between the active chips and the first surface respectively.

6. The semiconductor device package according to claim 1, further comprising a plurality of solder bumps disposed between the active chips and the first surface.

7. The semiconductor device package according to claim 1, wherein the active chips each comprise a first signal pad disposed on the first active surface, the bridge chip comprises two second signal pads disposed on the second active surface and in accordance with the first signal pads for capacitively or inductively coupling to the first signal pads.

8. A semiconductor device package, comprising:
   a substrate having a first surface and a second surface opposite to the first surface;
   a buffer structure disposed on the first surface;
   two pillar sets disposed on two sides of the buffer structure respectively, wherein each pillar set has a plurality of pillars;
   two active chips disposed on the pillar sets and electrically connected to the first surface, wherein the active chips both have a first active surface; and
   a bridge chip disposed on the buffer structure and below the active chips, wherein the bridge chip has a second active surface, the second active surface faces the first active surfaces and is partially overlapped with the first active surfaces, the bridge chip is used for providing a proximity communication between the two active chips.

9. The semiconductor device package according to claim 8, further comprising an underfill disposed between the pillar sets and the substrate.

10. The semiconductor device package according to claim 8, wherein the buffer structure comprises a vesicant material.

11. The semiconductor device package according to claim 10, wherein the vesicant material is a thermosetting material.

12. The semiconductor device package according to claim 8, wherein the buffer structure comprises a plurality of knobs.

13. The semiconductor device package according to claim 8, further comprising two adhesion layers disposed between the active chips and the bridge chip respectively.

14. The semiconductor device package according to claim 8, wherein the active chips each comprise a first signal pad disposed on the first active surface, the bridge chip comprises two second signal pads disposed on the second active surface and in accordance with the first signal pads for capacitively or inductively coupling to the first signal pads.

* * * * *